United States Patent
Yang (10) Patent No.: US 10,991,648 B1
(45) Date of Patent: Apr. 27, 2021

(54) REDISTRIBUTION LAYER STRUCTURE AND SEMICONDUCTOR PACKAGE

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/677,604

(22) Filed: Nov. 7, 2019

(51) Int. Cl.
*H01L 23/498* (2006.01)
*H01L 23/31* (2006.01)

(52) U.S. Cl.
CPC .... *H01L 23/49838* (2013.01); *H01L 23/3121* (2013.01); *H01L 23/49811* (2013.01); *H01L 23/49816* (2013.01)

(58) Field of Classification Search
CPC ................................................ H01L 23/49838
See application file for complete search history.

(56) References Cited

U.S. PATENT DOCUMENTS 5,308,928 A * 5/1994 Parla .................... H05K 1/0293
174/261

* cited by examiner

*Primary Examiner* — William A Harriston
(74) *Attorney, Agent, or Firm* — JCIPRNET (57) ABSTRACT

An RDL structure including a first pad, a second pad, a third pad, a fourth pad, a first switch device, a second switch device, a third switch device, and a fourth switch device is provided. The first pad, the second pad, the third pad, and the fourth pad are separated from each other. The first switch device includes a first conductive layer and a second conductive layer separated from each other. The second switch device includes a third conductive layer and a fourth conductive layer separated from each other. The third switch device includes a fifth conductive layer and a sixth conductive layer separated from each other. The fourth switch device includes a seventh conductive layer and an eighth conductive layer separated from each other.

19 Claims, 4 Drawing Sheets

REDISTRIBUTION LAYER STRUCTURE AND SEMICONDUCTOR PACKAGE

BACKGROUND OF THE INVENTION

Field of the Invention

The invention relates to a semiconductor structure, and particularly relates to a redistribution layer (RDL) structure and a semiconductor package.

Description of Related Art

In order for electronic product design to achieve being light, slim, short, and small, semiconductor packaging technology has kept progressing, in attempt to develop products that are smaller in volume, lighter in weight, higher in integration, and more competitive in market. For example, in some products, if a package requires multi-chip stacking, different RDL structures are generally required to provide the connection. However, since the different RDL structures need to be fabricated using different masks, the production cost is increased.

SUMMARY OF THE INVENTION

The invention provides an RDL structure and a semiconductor package, which can effectively reduce the production cost.

The invention provides an RDL structure, which includes a first pad, a second pad, a third pad, a fourth pad, a first switch device, a second switch device, a third switch device, and a fourth switch device. The first pad, the second pad, the third pad, and the fourth pad are separated from each other. The first switch device includes a first conductive layer and a second conductive layer separated from each other. The first conductive layer is coupled to the first pad. The second conductive layer is coupled to the third pad. The second switch device includes a third conductive layer and a fourth conductive layer separated from each other. The third conductive layer is coupled to the first pad. The fourth conductive layer is coupled to the fourth pad. The third switch device includes a fifth conductive layer and a sixth conductive layer separated from each other. The fifth conductive layer is coupled to the second pad. The sixth conductive layer is coupled to the third pad. The fourth switch device includes a seventh conductive layer and an eighth conductive layer separated from each other. The seventh conductive layer is coupled to the second pad. The eighth conductive layer is coupled to the fourth pad.

According to an embodiment of the invention, the RDL structure may further include a first conductive line, a second conductive line, a third conductive line, a fourth conductive line, a fifth conductive line, a sixth conductive line, a seventh conductive line, and an eighth conductive line. The first conductive line is coupled between the first conductive layer and the first pad. The second conductive line is coupled between the second conductive layer and the third pad. The third conductive line is coupled between the third conductive layer and the first pad. The fourth conductive line is coupled between the fourth conductive layer and the fourth pad. The fifth conductive line is coupled between the fifth conductive layer and the second pad. The sixth conductive line is coupled between the sixth conductive layer and the third pad. The seventh conductive line is coupled between the seventh conductive layer and the second pad. The eighth conductive line is coupled between the eighth conductive layer and the fourth pad.

According to an embodiment of the invention, in the RDL structure, the first conductive line, the first conductive layer, and the first pad may be integrally formed. The second conductive line, the second conductive layer, and the third pad may be integrally formed. The third conductive line, the third conductive layer, and the first pad may be integrally formed. The fourth conductive line, the fourth conductive layer, and the fourth pad may be integrally formed. The fifth conductive line, the fifth conductive layer, and the second pad may be integrally formed. The sixth conductive line, the sixth conductive layer, and the third pad may be integrally formed. The seventh conductive line, the seventh conductive layer, and the second pad may be integrally formed. The eighth conductive line, the eighth conductive layer, and the fourth pad may be integrally formed.

According to an embodiment of the invention, the RDL structure may further include a fifth pad and a sixth pad. The fifth pad is coupled to the third pad. The sixth pad is coupled to the fourth pad.

According to an embodiment of the invention, the RDL structure may further include a ninth conductive line and a tenth conductive line. The ninth conductive line is coupled between the third pad and the fifth pad. The tenth conductive line is coupled between the fourth pad and the sixth pad.

According to an embodiment of the invention, in the RDL structure, the ninth conductive line, the third pad, and the fifth pad may be integrally formed. The tenth conductive line, the fourth pad, and the sixth pad may be integrally formed.

According to an embodiment of the invention, the RDL structure may further include at least one dummy pad. The dummy pad is separated from the first pad, the second pad, the third pad, the fourth pad, the first switch device, the second switch device, the third switch device, and the fourth switch device.

The invention provides a semiconductor package, which includes a first die, a second die, a first RDL structure, and a second RDL structure. The first RDL structure is disposed on the first die. The second RDL structure is disposed on the second die. The first RDL structure and the second RDL structure respectively include the above-mentioned RDL structure. The first RDL structure and the second RDL structure are located between the first die and the second die and coupled to each other.

According to an embodiment of the invention, in the semiconductor package, the third pad of the first RDL structure may be coupled to the fourth pad of the second RDL structure. The fourth pad of the first RDL structure may be coupled to the third pad of the second RDL structure.

According to an embodiment of the invention, the semiconductor package may further include a first electrical connector and a second electrical connector. The first electrical connector is coupled between the third conductive layer of the first RDL structure and the fourth conductive layer of the first RDL structure. The second electrical connector is coupled between the fifth conductive layer of the first RDL structure and the sixth conductive layer of the first RDL structure.

According to an embodiment of the invention, the semiconductor package may further include a third electrical connector and a fourth electrical connector. The third electrical connector is coupled between the first conductive layer of the second RDL structure and the second conductive layer of the second RDL structure. The fourth electrical connector is coupled between the seventh conductive layer of the second RDL structure and the eighth conductive layer of the second RDL structure.

According to an embodiment of the invention, the semiconductor package may further include a fifth electrical connector and a sixth electrical connector. The fifth electrical connector is coupled between the third pad of the first RDL structure and the fourth pad of the second RDL structure. The sixth electrical connector is coupled between the fourth pad of the first RDL structure and the third pad of the second RDL structure.

According to an embodiment of the invention, in the semiconductor package, the RDL structure may further include a first conductive line, a second conductive line, a third conductive line, a fourth conductive line, a fifth conductive line, a sixth conductive line, a seventh conductive line, and an eighth conductive line. The first conductive line is coupled between the first conductive layer and the first pad. The second conductive line is coupled between the second conductive layer and the third pad. The third conductive line is coupled between the third conductive layer and the first pad. The fourth conductive line is coupled between the fourth conductive layer and the fourth pad. The fifth conductive line is coupled between the fifth conductive layer and the second pad. The sixth conductive line is coupled between the sixth conductive layer and the third pad. The seventh conductive line is coupled between the seventh conductive layer and the second pad. The eighth conductive line is coupled between the eighth conductive layer and the fourth pad.

According to an embodiment of the invention, in the semiconductor package, the first conductive line, the first conductive layer, and the first pad may be integrally formed. The second conductive line, the second conductive layer, and the third pad may be integrally formed. The third conductive line, the third conductive layer, and the first pad may be integrally formed. The fourth conductive line, the fourth conductive layer, and the fourth pad may be integrally formed. The fifth conductive line, the fifth conductive layer, and the second pad may be integrally formed. The sixth conductive line, the sixth conductive layer, and the third pad may be integrally formed. The seventh conductive line, the seventh conductive layer, and the second pad may be integrally formed. The eighth conductive line, the eighth conductive layer, and the fourth pad may be integrally formed.

According to an embodiment of the invention, in the semiconductor package, the RDL structure may further include a fifth pad and a sixth pad. The fifth pad is coupled to the third pad. The sixth pad is coupled to the fourth pad.

According to an embodiment of the invention, in the semiconductor package, the RDL structure may further include a ninth conductive line and a tenth conductive line. The ninth conductive line is coupled between the third pad and the fifth pad. The tenth conductive line is coupled between the fourth pad and the sixth pad.

According to an embodiment of the invention, in the semiconductor package, the ninth conductive line, the third pad, and the fifth pad may be integrally formed. The tenth conductive line, the fourth pad, and the sixth pad may be integrally formed.

According to an embodiment of the invention, in the semiconductor package, the RDL structure may further include at least one dummy pad. The dummy pad is separated from the first pad, the second pad, the third pad, the fourth pad, the first switch device, the second switch device, the third switch device, and the fourth switch device.

According to an embodiment of the invention, the semiconductor package may further include a substrate. The first die and the second die may be stacked on the substrate. The second die may be located between the first die and the substrate.

According to an embodiment of the invention, the semiconductor package may further include an encapsulant. The first die and the second die are encapsulated by the encapsulant.

Based on the above, the RDL structure according to the invention includes the first switch device, the second switch device, the third switch device, and the fourth switch device. Therefore, the coupling relationship between the pads can be determined by respectively setting the first switch device, the second switch device, the third switch device, and the fourth switch device to the "on state" or the "off state". In this way, various wiring methods of RDL can be achieved by the same RDL structure. In the semiconductor package according to the invention, since the RDL structure can be used to achieve various wiring methods of RDL, the first die and the second die can be coupled to each other by the first and second RDL structures having the same RDL layout pattern. Therefore, the quantity of the photomask can be effectively reduced, and the production cost can be reduced.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
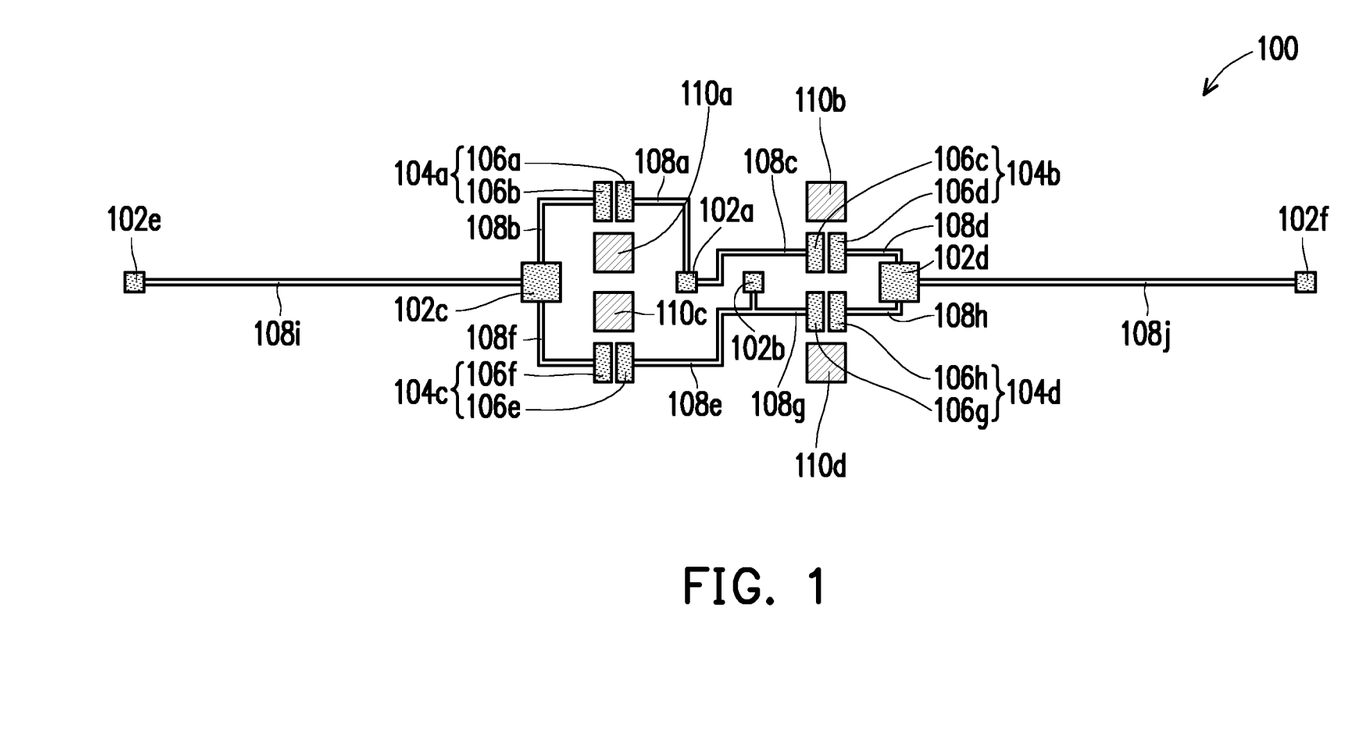
FIG. 1 is a top view illustrating an RDL structure according to an embodiment of the invention.

FIG. 1 is a top view illustrating an RDL structure according to an embodiment of the invention.

Referring to FIG. 1A, an RDL structure 100 includes a pad 102a, a pad 102b, a pad 102c, a pad 102d, a switch device 104a, a switch device 104b, a switch device 104c, and a switch device 104d. RDL structure 100 is, for example, an RDL layout pattern.

The pad 102a, the pad 102b, the pad 102c, and the pad 102d are separated from each other. In the present embodiment, the pad 102a and the pad 102b can be used as die pads, and the pad 102c and the pad 102d can be used as solder pads, but the invention is not limited thereto. Furthermore, the pad 102a and the pad 102b are, for example, located between the pad 102c and the pad 102d, but the invention is not limited thereto. One of ordinary skill in the art can adjust the arrangement of the pad 102a, the pad 102b, the pad 102c, and the pad 102d according to the product design. The material of the pads 102a-102d is, for example, copper (Cu), aluminum (Al), nickel (Ni), or gold (Au).

The switch device 104a includes a conductive layer 106a and a conductive layer 106b separated from each other. The conductive layer 106a is coupled to the pad 102a. The conductive layer 106b is coupled to the pad 102c. The switch device 104b includes a conductive layer 106c and a conductive layer 106d separated from each other. The conductive layer 106c is coupled to the pad 102a. The conductive layer 106d is coupled to the pad 102d. The switch device 104c includes a conductive layer 106e and a conductive layer 106f separated from each other. The conductive layer 106e is coupled to the pad 102b. The conductive layer 106f is coupled to the pad 102c. The switch device 104d includes a conductive layer 106g and a conductive layer 106h separated from each other. The conductive layer 106g is coupled to the pad 102b. The conductive layer 106h is coupled to the pad 102d. In the present embodiment, the term "coupled" may be "directly coupled" or "indirectly coupled". The material of the conductive layers 106a-106h is, for example, copper (Cu), aluminum (Al), nickel (Ni), or gold (Au).

The switch device 104a can be used to determine the coupling relationship between the pad 102a and the pad 102c. The switch device 104b can be used to determine the coupling relationship between the pad 102a and the pad 102d. The switch device 104c can be used to determine the coupling relationship between the pad 102b and the pad 102c. The switch device 104d can be used to determine the coupling relationship between the pad 102b and the pad 102d.

Hereinafter, the switch device 104a is taken as an example for explanation. When the conductive layer 106a and the conductive layer 106b are not coupled to each other, the switch device 104a is in the "off state", and the pad 102a and the pad 102c are not coupled to each other. When the conductive layer 106a and the conductive layer 106b are coupled to each other by an electrical connector (e.g., solder ball), the switch device 104a is in the "on state", and the pad 102a and the pad 102c are coupled to each other.

Moreover, the RDL structure 100 may further include a conductive line 108a, a conductive line 108b, a conductive line 108c, a conductive line 108d, a conductive line 108e, a conductive line 108f, a conductive line 108g, and a conductive line 108h. The conductive line 108a is coupled between the conductive layer 106a and the pad 102a. The conductive line 108a, the conductive layer 106a, and the pad 102a may be integrally formed. The conductive line 108b is coupled between the conductive layer 106b and the pad 102c. The conductive line 108b, the conductive layer 106b, and the pad 102c may be integrally formed. The conductive line 108c is coupled between the conductive layer 106c and the pad 102a. The conductive line 108c, the conductive layer 106c, and the pad 102a may be integrally formed. The conductive line 108d is coupled between the conductive layer 106d and the pad 102d. The conductive line 108d, the conductive layer 106d, and the pad 102d may be integrally formed. The conductive line 108e is coupled between the conductive layer 106e and the pad 102b. The conductive line 108e, the conductive layer 106e, and the pad 102b may be integrally formed. The conductive line 108f is coupled between the conductive layer 106f and the pad 102c. The conductive line 108f, the conductive layer 106f, and the pad 102c may be integrally formed. The conductive line 108g is coupled between the conductive layer 106g and the pad 102b. The conductive line 108g, the conductive layer 106g, and the pad 102b may be integrally formed. The conductive line 108h is coupled between the conductive layer 106h and the pad 102d. The conductive line 108h, the conductive layer 106h, and the pad 102d may be integrally formed. The material of the conductive lines 108a~108h is, for example, copper (Cu), aluminum (Al), nickel (Ni), or gold (Au).

The conductive lines coupled to the same pad may be separated from each other or have the shared portion. Hereinafter, the conductive lines 108a, 108c, 108e, and 108g are taken as examples for explanation. In the present embodiment, the conductive line 108a and the conductive line 108c are coupled to the same pad 102a and separated from each other, but the invention is not limited thereto. In other embodiment, the conductive line 108a and the conductive line 108c coupled to the same pad 102a may have the shared portion. In the present embodiment, the conductive line 108e and the conductive line 108g are coupled to the same pad 102b and have the shared portion, but the invention is not limited thereto. In other embodiment, the conductive line 108e and the conductive line 108g coupled to the same pad 102b may be separated from each other.

In addition, the RDL structure 100 may further include a pad 102e and a pad 102f. The pad 102e is coupled to the pad 102c. The pad 102f is coupled to the pad 102d. The pad 102e and the pad 102f can be used as bond pads. The material of the pads 102e and 102f is, for example, copper (Cu), aluminum (Al), nickel (Ni), or gold (Au).

Besides, the RDL structure 100 may further include a conductive line 108i and a conductive line 108j. The conductive line 108i is coupled between the pad 102c and the pad 102e. The conductive line 108i, the pad 102c, and the pad 102e may be integrally formed. The conductive line 108j is coupled between the pad 102d and the pad 102f. The conductive line 108j, the pad 102d, and the pad 102f may be integrally formed. The material of the conductive lines 108i and 108j is, for example, copper (Cu), aluminum (Al), nickel (Ni), or gold (Au).

Furthermore, the RDL structure 100 may further include at least one dummy pad. For example, the RDL structure 100 may include a dummy pad 110a, a dummy pad 110b, a dummy pad 110c, and a dummy pad 110d, but the invention is not limited thereto. The dummy pads 110a~110d are separated from the pads 102a~102f, the switch devices 104a~104d, and the conductive lines 108a~108j. The dummy pads 110a~110d can be used to support the electrical connectors (e.g., solder ball) (not shown).

Based on the above, in the RDL structure 100 of the aforementioned embodiments, the coupling relationship between the pads can be determined by respectively setting the switch device 104a, the switch device 104b, the switch device 104c, and the switch device 104d to the "on state" or the "off state". In this way, various wiring methods of RDL can be achieved by the same RDL structure 100, so that the quantity of the photomask can be effectively reduced, thereby reducing the production cost.

Figure 2:
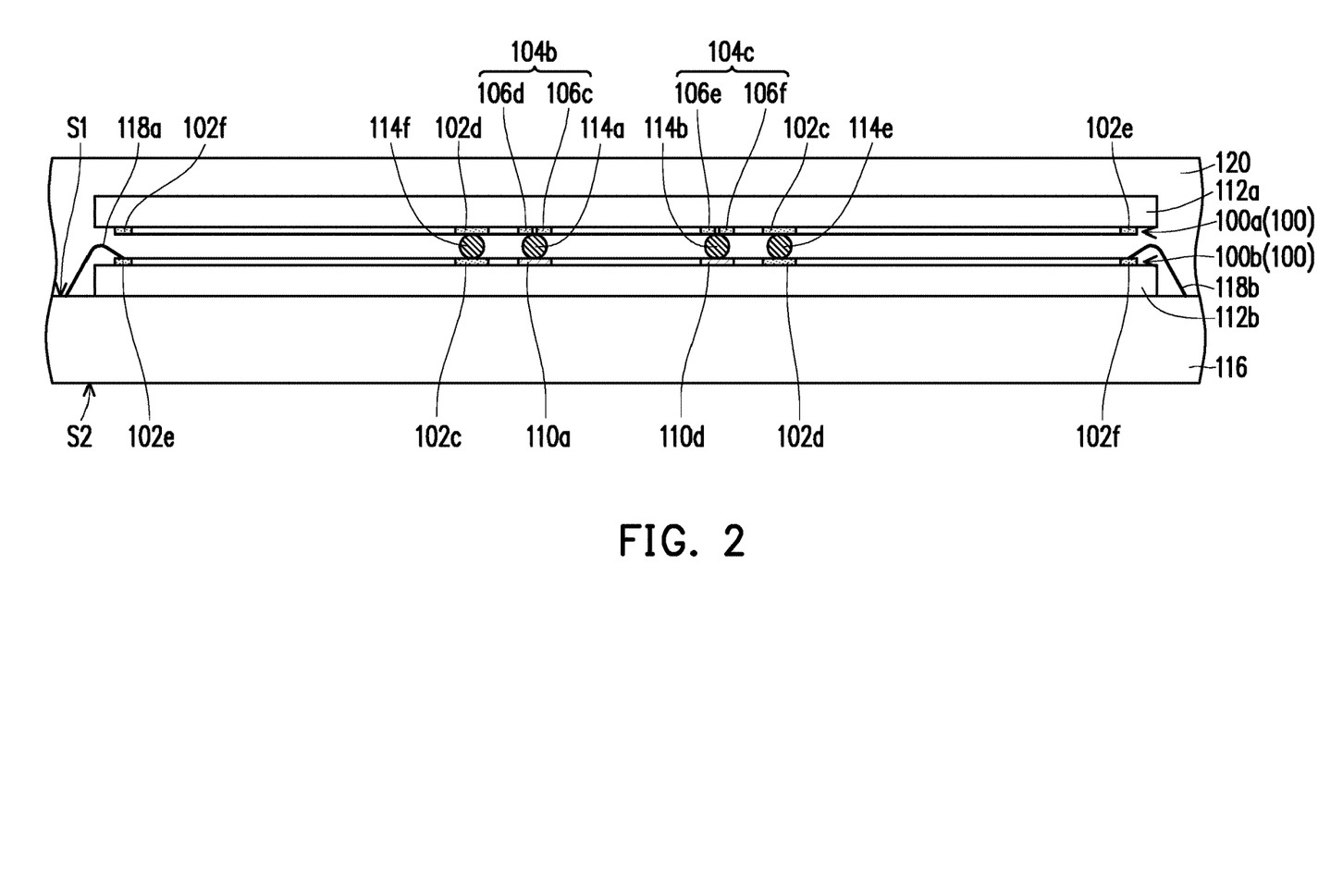
FIG. 2 is a side view illustrating a semiconductor package according to an embodiment of the invention.
Figure 3:
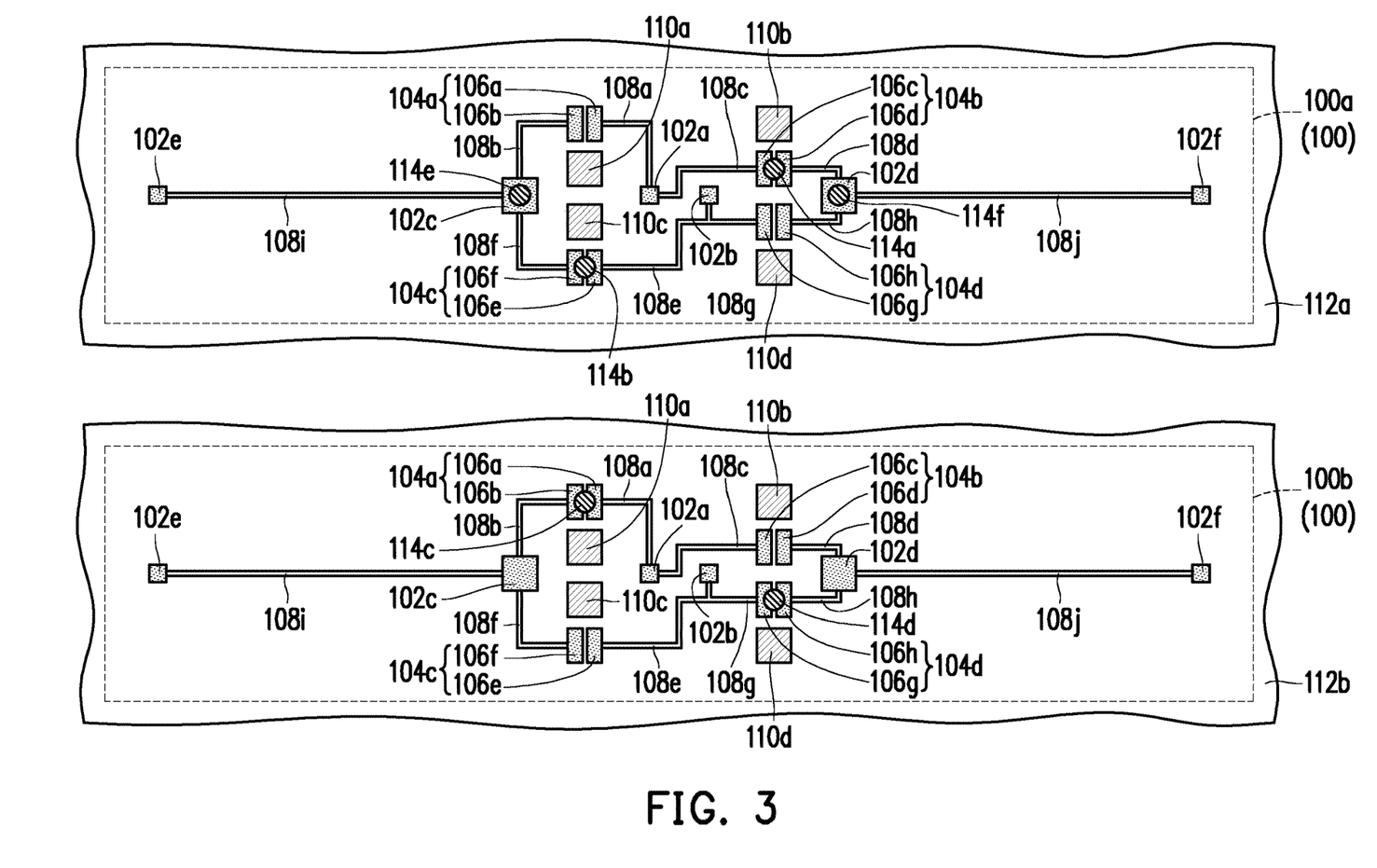
FIG. 3 is a top view illustrating the RDL structures disposed on the dies in FIG. 2.
Figure 4:
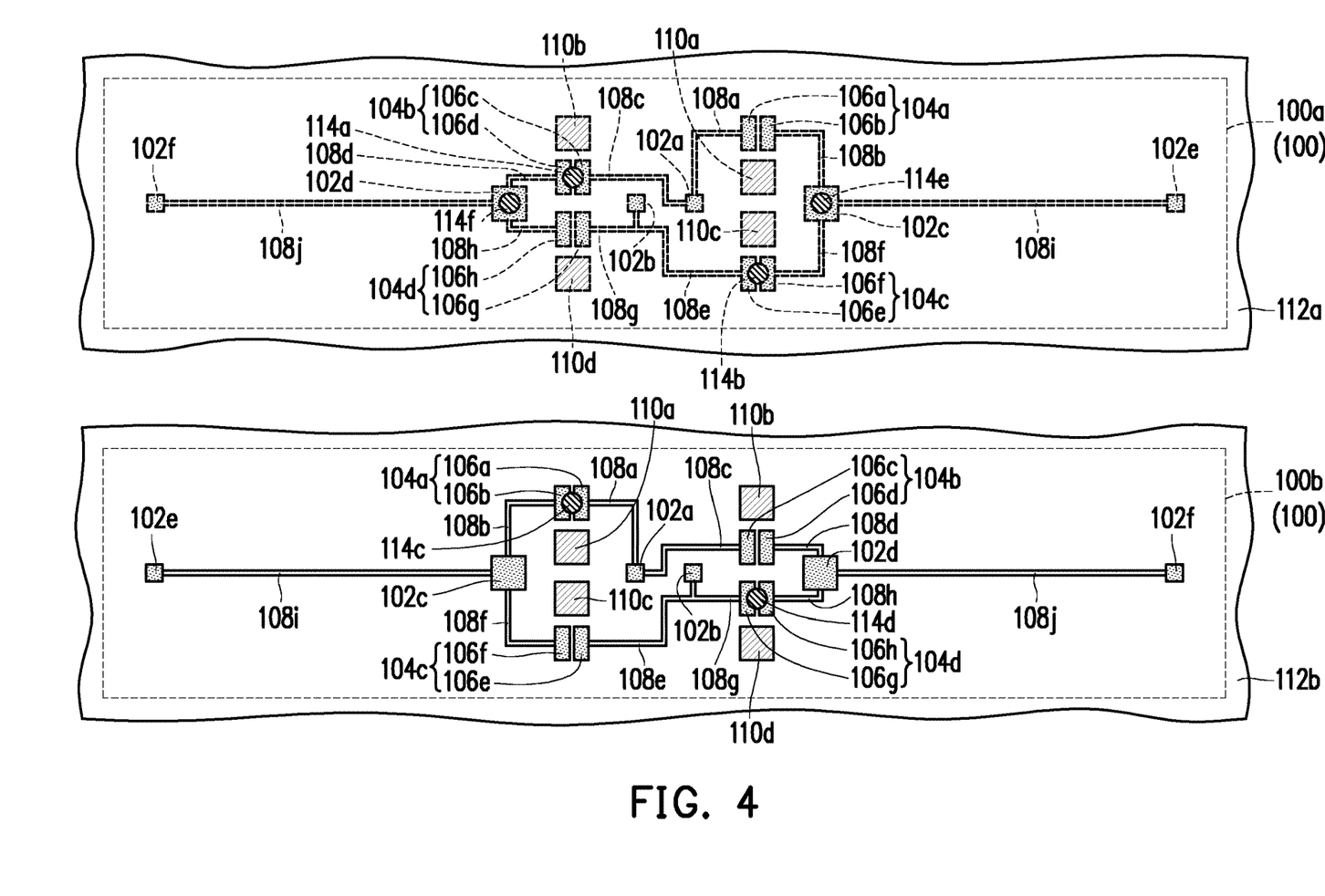
FIG. 4 is a schematic diagram illustrating the RDL structures after flipping one of the dies of FIG. 3.

FIG. 2 is a side view illustrating a semiconductor package according to an embodiment of the invention. Some of the components and reference numerals are omitted in FIG. 2 to clearly illustrate the arrangement relationship between the electrical connectors 114a, 114b, 114e, 114f and the components coupled to the electrical connectors 114a, 114b, 114e, 114f. FIG. 3 is a top view illustrating the RDL structures disposed on the dies in FIG. 2. FIG. 4 is a schematic diagram illustrating the RDL structures after flipping one of the dies of FIG. 3.

Referring to FIG. 1 to FIG. 4, a semiconductor package 10 includes a die 112a, a die 112b, an RDL structure 100a, and an RDL structure 100b. In the present embodiment, the above-mentioned RDL structure 100 is exemplified by applying to the semiconductor package 10, but the invention is not limited thereto.

The RDL structure 100 can be applied to any semiconductor package 10 to flexibly design the wiring method of RDL. The semiconductor package 10 is, for example, a dual die package (DDP), but the invention is not limited thereto. In the present embodiment, the semiconductor package 10 is exemplified by a flip chip package (FCP).

The RDL structure 100a is disposed on the die 112a. The RDL structure 100b is disposed on the die 112b. The RDL structure 100a and the RDL structure 100b respectively include the above-mentioned RDL structure 100. In other words, the RDL structure 100a and the RDL structure 100b include all of the components of the RDL structure 100. The pad 102a of the RDL structure 100a and the pad 102b of the RDL structure 100a may be coupled to the die 112a. The pad 102a of the RDL structure 100b and the pad 102b of the RDL structure 100b may be coupled to the die 112b. Furthermore, the material, the arrangement, and the effect of each component of the RDL structure 100 have been described in detail in the above embodiments, and are not repeated herein.

The RDL structure 100a and the RDL structure 100b are located between the die 112a and the die 112b and coupled to each other. For example, the pad 102c of the RDL structure 100a may be coupled to the pad 102d of the RDL structure 100b, and the pad 102d of the RDL structure 100a may be coupled to the pad 102c of the RDL structure 100b.

The semiconductor package 10 may further include at least one of an electrical connector 114a, an electrical connector 114b, an electrical connector 114c, an electrical connector 114d, an electrical connector 114e, an electrical connector 114f, a substrate 116, a bonding wire 118a, a bonding wire 118b, and an encapsulant 120. The electrical connectors 114a-114f are, for example, solder balls, conductive pillars (e.g., copper pillar), a combination thereof, or the like. In the present embodiment, the electrical connectors 114a-114f are exemplified by solder balls, but the invention is not limited thereto.

The electrical connector 114a is coupled between the conductive layer 106c of the RDL structure 100a and the conductive layer 106d of the RDL structure 100a. Thereby, in the RDL structure 100a, the switch device 104b is in the "on state", and the pad 102a and the pad 102d are coupled to each other. The electrical connector 114b is coupled between the conductive layer 106e of the RDL structure 100a and the conductive layer 106f of the RDL structure 100a. Thereby, in the RDL structure 100a, the switch device 104c is in the "on state", and the pad 102b and the pad 102c are coupled to each other. Furthermore, in the RDL structure 100a, since the switch device 104a and the switch device 104d are in the "off state", the pad 102a and the pad 102c are not coupled to each other, and the pad 102b and the pad 102d are not coupled to each other.

The electrical connector 114c is coupled between the conductive layer 106a of the RDL structure 100b and the conductive layer 106b of the RDL structure 100b. Thereby, in the RDL structure 100b, the switch device 104a is in the "on state", and the pad 102a and the pad 102c are coupled to each other. The electrical connector 114d is coupled between the conductive layer 106g of the RDL structure 100b and the conductive layer 106h of the RDL structure 100b. Thereby, in the RDL structure 100b, the switch device 104d is in the "on state", and the pad 102b and the pad 102d are coupled to each other. Furthermore, in the RDL structure 100b, since the switch device 104b and the switch device 104c are in the "off state", the pad 102a and the pad 102d are not coupled to each other, and the pad 102b and the pad 102c are not coupled to each other.

The electrical connector 114e is coupled between the pad 102c of the RDL structure 100a and the pad 102d of the RDL structure 100b. The electrical connector 114f is coupled between the pad 102d of the RDL structure 100a and the pad 102c of the RDL structure 100b. Thereby, the RDL structure 100a and the RDL structure 100b can be coupled to each other.

In this way, the pad 102a of the RDL structure 100a and the pad 102a of the RDL structure 100b can be coupled to each other, and the pad 102b of the RDL structure 100a and the pad 102b of the RDL structure 100b can be coupled to each other. Moreover, since the RDL structure 100 can be used to achieve various wiring methods of RDL, the die 112a and the die 112b can be coupled to each other by the RDL structures 100a and 100b having the same RDL layout pattern. Therefore, the quantity of the photomask can be effectively reduced, and the production cost can be reduced.

Furthermore, the dummy pad 110b of the RDL structure 100a can be used to support the electrical connector 114c. The dummy pad 110c of the RDL structure 100a can be used to support the electrical connector 114d. The dummy pad 110a of the RDL structure 100b can be used to support the electrical connector 114a. The dummy pad 110d of the RDL structure 100b can be used to support the electrical connector 114b.

The die 112a and the die 112b may be stacked on the substrate 116. The die 112b may be located between the die 112a and the substrate 116, but the invention is not limited thereto. Furthermore, the substrate 116 may have a first side S1 and a second side S2 opposite to each other. The die 112a and the die 112b may be located on the first side S1. The substrate 116 is, for example, a package substrate such as a printed circuit board (PCB).

The bonding wires 118a and 118b can be used to couple the RDL structure 100b to the substrate 116, but the invention is not limited thereto. For example, the bonding wires 118a may be coupled between the pad 102e of the RDL structure 100b and the substrate 116, and the bonding wires 118b may be coupled between the pad 102f of the RDL structure 100b and the substrate 116.

The die 112a and the die 112b are encapsulated by the encapsulant 120. Therefore, the encapsulant 120 can be used to protect the die 112a and the die 112b. The encapsulant 120 includes a molding compound, a resin such as epoxy, a combination thereof, or the like.

In the present embodiment, the semiconductor package 10 is exemplified by including one RDL structure 100a and one RDL structure 100b, but the invention is not limited thereto. In other embodiment, the semiconductor package 10 may include a plurality of RDL structures 100a disposed on the die 112a and a plurality of RDL structures 100b disposed on the die 112b.

In some embodiments, the semiconductor package 10 may further include other components known in the art (e.g., an under bump metallization (UBM) layer (not shown) or at least one electrical connector (not shown) located on the second side S2 of the substrate 116), and will not be described herein.

Based on the above, in the semiconductor package 10 of the aforementioned embodiments, since the RDL structure 100 can be used to achieve various wiring methods of RDL, the die 112a and the die 112b can be coupled to each other by the RDL structures 100a and 100b having the same RDL layout pattern. Therefore, the quantity of the photomask can be effectively reduced, and the production cost can be reduced.

In summary, in the RDL structure and the semiconductor package of the aforementioned embodiments, various wiring methods of RDL can be achieved by the same RDL structure, so that the quantity of the photomask can be effectively reduced, thereby reducing the production cost.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A redistribution layer (RDL) structure, comprising:
   a first pad, a second pad, a third pad, and a fourth pad separated from each other;
   a fifth pad coupled to the third pad;
   a sixth pad coupled to the fourth pad;
   a first switch device comprising a first conductive layer and a second conductive layer separated from each other, wherein the first conductive layer is coupled to the first pad, and the second conductive layer is coupled to the third pad;
   a second switch device comprising a third conductive layer and a fourth conductive layer separated from each other, wherein the third conductive layer is coupled to the first pad, and the fourth conductive layer is coupled to the fourth pad;
   a third switch device comprising a fifth conductive layer and a sixth conductive layer separated from each other, wherein the fifth conductive layer is coupled to the second pad, and the sixth conductive layer is coupled to the third pad; and
   a fourth switch device comprising a seventh conductive layer and an eighth conductive layer separated from each other, wherein the seventh conductive layer is coupled to the second pad, and the eighth conductive layer is coupled to the fourth pad.

2. The RDL structure according to claim 1, further comprising:
   a first conductive line coupled between the first conductive layer and the first pad;
   a second conductive line coupled between the second conductive layer and the third pad;
   a third conductive line coupled between the third conductive layer and the first pad;
   a fourth conductive line coupled between the fourth conductive layer and the fourth pad;
   a fifth conductive line coupled between the fifth conductive layer and the second pad;
   a sixth conductive line coupled between the sixth conductive layer and the third pad;
   a seventh conductive line coupled between the seventh conductive layer and the second pad; and
   an eighth conductive line coupled between the eighth conductive layer and the fourth pad.

3. The RDL structure according to claim 2, wherein
   the first conductive line, the first conductive layer, and the first pad are integrally formed,
   the second conductive line, the second conductive layer, and the third pad are integrally formed,
   the third conductive line, the third conductive layer, and the first pad are integrally formed,
   the fourth conductive line, the fourth conductive layer, and the fourth pad are integrally formed,
   the fifth conductive line, the fifth conductive layer, and the second pad are integrally formed,
   the sixth conductive line, the sixth conductive layer, and the third pad are integrally formed,
   the seventh conductive line, the seventh conductive layer, and the second pad are integrally formed, and
   the eighth conductive line, the eighth conductive layer, and the fourth pad are integrally formed.

4. The RDL structure according to claim 1, further comprising:
   a ninth conductive line coupled between the third pad and the fifth pad; and
   a tenth conductive line coupled between the fourth pad and the sixth pad.

5. The RDL structure according to claim 4, wherein
   the ninth conductive line, the third pad, and the fifth pad are integrally formed, and
   the tenth conductive line, the fourth pad, and the sixth pad are integrally formed.

6. An RDL structure, comprising:
   a first pad, a second pad, a third pad, and a fourth pad separated from each other;
   a first switch device comprising a first conductive layer and a second conductive layer separated from each other, wherein the first conductive layer is coupled to the first pad, and the second conductive layer is coupled to the third pad;
   a second switch device comprising a third conductive layer and a fourth conductive layer separated from each other, wherein the third conductive layer is coupled to the first pad, and the fourth conductive layer is coupled to the fourth pad;
   a third switch device comprising a fifth conductive layer and a sixth conductive layer separated from each other, wherein the fifth conductive layer is coupled to the second pad, and the sixth conductive layer is coupled to the third pad;
   a fourth switch device comprising a seventh conductive layer and an eighth conductive layer separated from each other, wherein the seventh conductive layer is coupled to the second pad, and the eighth conductive layer is coupled to the fourth pad; and
   at least one dummy pad separated from the first pad, the second pad, the third pad, the fourth pad, the first switch device, the second switch device, the third switch device, and the fourth switch device.

7. A semiconductor package, comprising:
   a first die;
   a second die;
   a first RDL structure disposed on the first die; and
   a second RDL structure disposed on the second die, wherein
   the first RDL structure and the second RDL structure respectively comprise an RDL structure comprising:
      a first pad, a second pad, a third pad, and a fourth pad separated from each other;
      a first switch device comprising a first conductive layer and a second conductive layer separated from each other, wherein the first conductive layer is coupled to the first pad, and the second conductive layer is coupled to the third pad;
      a second switch device comprising a third conductive layer and a fourth conductive layer separated from each other, wherein the third conductive layer is coupled to the first pad, and the fourth conductive layer is coupled to the fourth pad;
      a third switch device comprising a fifth conductive layer and a sixth conductive layer separated from each other, wherein the fifth conductive layer is coupled to the second pad, and the sixth conductive layer is coupled to the third pad; and a fourth switch device comprising a seventh conductive layer and an eighth conductive layer separated from each other, wherein the seventh conductive layer is coupled to the second pad, and the eighth conductive layer is coupled to the fourth pad, and the first RDL structure and the second RDL structure are located between the first die and the second die and coupled to each other.

8. The semiconductor package according to claim 7, wherein the third pad of the first RDL structure is coupled to the fourth pad of the second RDL structure, and the fourth pad of the first RDL structure is coupled to the third pad of the second RDL structure.

9. The semiconductor package according to claim 8, further comprising:

a first electrical connector coupled between the third conductive layer of the first RDL structure and the fourth conductive layer of the first RDL structure; and a second electrical connector coupled between the fifth conductive layer of the first RDL structure and the sixth conductive layer of the first RDL structure.

10. The semiconductor package according to claim 9, further comprising:

a third electrical connector coupled between the first conductive layer of the second RDL structure and the second conductive layer of the second RDL structure; and a fourth electrical connector coupled between the seventh conductive layer of the second RDL structure and the eighth conductive layer of the second RDL structure.

11. The semiconductor package according to claim 8, further comprising:

a fifth electrical connector coupled between the third pad of the first RDL structure and the fourth pad of the second RDL structure; and a sixth electrical connector coupled between the fourth pad of the first RDL structure and the third pad of the second RDL structure.

12. The semiconductor package according to claim 7, wherein the RDL structure further comprises:

a first conductive line coupled between the first conductive layer and the first pad;

a second conductive line coupled between the second conductive layer and the third pad;

a third conductive line coupled between the third conductive layer and the first pad;

a fourth conductive line coupled between the fourth conductive layer and the fourth pad;

a fifth conductive line coupled between the fifth conductive layer and the second pad;

a sixth conductive line coupled between the sixth conductive layer and the third pad;

a seventh conductive line coupled between the seventh conductive layer and the second pad; and an eighth conductive line coupled between the eighth conductive layer and the fourth pad.

13. The semiconductor package according to claim 12, wherein the first conductive line, the first conductive layer, and the first pad are integrally formed, the second conductive line, the second conductive layer, and the third pad are integrally formed, the third conductive line, the third conductive layer, and the first pad are integrally formed, the fourth conductive line, the fourth conductive layer, and the fourth pad are integrally formed, the fifth conductive line, the fifth conductive layer, and the second pad are integrally formed, the sixth conductive line, the sixth conductive layer, and the third pad are integrally formed, the seventh conductive line, the seventh conductive layer, and the second pad are integrally formed, and the eighth conductive line, the eighth conductive layer, and the fourth pad are integrally formed.

14. The semiconductor package according to claim 7, wherein the RDL structure further comprises:

a fifth pad coupled to the third pad; and a sixth pad coupled to the fourth pad.

15. The semiconductor package according to claim 14, wherein the RDL structure further comprises:

a ninth conductive line coupled between the third pad and the fifth pad; and a tenth conductive line coupled between the fourth pad and the sixth pad.

16. The semiconductor package according to claim 15, wherein the ninth conductive line, the third pad, and the fifth pad are integrally formed, and the tenth conductive line, the fourth pad, and the sixth pad are integrally formed.

17. The semiconductor package according to claim 7, wherein the RDL structure further comprises:

at least one dummy pad separated from the first pad, the second pad, the third pad, the fourth pad, the first switch device, the second switch device, the third switch device, and the fourth switch device.

18. The semiconductor package according to claim 7, further comprising:

a substrate, wherein the first die and the second die are stacked on the substrate, and the second die is located between the first die and the substrate.

19. The semiconductor package according to claim 7, further comprising:

an encapsulant, wherein the first die and the second die are encapsulated by the encapsulant.

* * * * *